(12) United States Patent
Seko

(10) Patent No.: US 6,559,524 B2
(45) Date of Patent: May 6, 2003

(54) COF-USE TAPE CARRIER AND COF-STRUCTURED SEMICONDUCTOR DEVICE USING THE SAME

(75) Inventor: Toshiharu Seko, Nara-ken (JP)

(73) Assignee: Sharp Kabushiki Kaisha, Osaka (JP)

( * ) Notice: Subject to any disclaimer, the term of this patent is extended or adjusted under 35 U.S.C. 154(b) by 40 days.

(21) Appl. No.: 09/956,811

(22) Filed: Sep. 21, 2001

(65) Prior Publication Data

US 2002/0043713 A1 Apr. 18, 2002

(30) Foreign Application Priority Data

Oct. 13, 2000 (JP) ........................ 2000-313686

(51) Int. Cl.[7] ........................ H01L 23/495; H01L 21/44
(52) U.S. Cl. ........................ 257/673; 257/674; 257/724; 257/735; 257/775; 257/778; 438/110; 438/119; 367/749; 174/259
(58) Field of Search ........................ 257/666, 668, 257/674, 673, 678, 723, 724, 730, 735, 775, 778, 780, 782, 783, 787; 438/106, 108, 110, 118, 119; 361/748, 749, 760, 783, 820; 174/259, 268

(56) References Cited

U.S. PATENT DOCUMENTS

| | | | | |
|---|---|---|---|---|
| 5,260,168 A | * | 11/1993 | Vernon | 430/313 |
| 5,378,581 A | * | 1/1995 | Vernon | 430/313 |
| 5,825,081 A | | 10/1998 | Hosomi et al. | 257/668 |
| 6,313,526 B1 | * | 11/2001 | Nakamura | 257/706 |
| 6,320,135 B1 | * | 11/2001 | Saito | 174/250 |
| 6,388,888 B1 | * | 5/2002 | Seko et al. | 361/767 |
| 6,433,414 B2 | * | 8/2002 | Saito | 257/684 |

FOREIGN PATENT DOCUMENTS

| | | | |
|---|---|---|---|
| JP | 9-129686 | | 5/1997 |
| JP | 2001 176918 | * | 6/2001 |
| JP | 2002 217246 | * | 8/2002 |

* cited by examiner

*Primary Examiner*—David L. Talbott
*Assistant Examiner*—Alonzo Chambliss
(74) *Attorney, Agent, or Firm*—Nixon & Vanderhye, P.C.

(57) ABSTRACT

A COF-use tape carrier for a semiconductor device has dummy leads not to be electrically connected to a semiconductor chip, in the proximity of an edge of an opening of a solder resist. The dummy leads are provided on an insulating tape, between adjacent two inner leads that are relatively widely spaced from each other. The dummy leads extend across the edge of the opening of the solder resist, so that one end of each dummy lead is located within the opening of the solder resist, while the other end of the dummy lead is located under the solder resist. A semiconductor chip is to be mounted on a chip-mounting region of the insulating tape.

21 Claims, 5 Drawing Sheets

A COF-USE TAPE CARRIER AND COF-STRUCTURED SEMICONDUCTOR DEVICE USING THE SAME

BACKGROUND OF THE INVENTION

The present invention relates to a semiconductor device having a structure called chip-on-film (COF), in which a semiconductor chip is mounted on a flexible wiring board. More particularly, it relates to a tape carrier to be used for producing such a semiconductor device.

Besides the COF-structured semiconductor device (hereinafter simply referred to as "COF semiconductor device"), a tape carrier package (TCP) can be mentioned as a semiconductor device in which a semiconductor chip is mounted on a flexible wiring board, can be mentioned. The difference between these devices is as follows. In the TCP, an insulating tape as a base material of the flexible wiring board has an opening in a chip-mounting region (a portion where a semiconductor chip is mounted), and tip portions of a wiring pattern projecting into the opening like cantilevers are bonded to the semiconductor chip. On the other hand, in the COF semiconductor device, an insulating tape has no opening, and a semiconductor chip is bonded to a wiring pattern formed on a surface of the insulating tape.

FIGS. 8 and 9 show the structure of a conventional COF semiconductor device. FIG. 8 is a plan view of essential parts of the conventional semiconductor device. FIG. 9 is a sectional view taken along the line IX—IX of FIG. 8. In these figures, the reference numeral 1 indicates a semiconductor chip, reference numeral 2 indicates a protrusion electrode (bump) of the semiconductor device 1, reference numeral 3 indicates a sealing resin, reference numeral 4 indicates an insulating tape, reference numeral 5 indicates a wiring pattern and reference numeral 6 indicates a solder resist having an opening 6a. The wiring pattern 5 includes a plurality of inner leads 8 having, at their tips, electrically connecting portions (hereinafter referred to as simply "connecting portions") 8a that are electrically connected to the protrusion electrodes 2, and unshown connectors for external connection, namely, outer leads. The solder resist 6 is applied to wiring pattern portions other than the connecting portions 8a and the outer leads to secure an insulating state.

In the COF semiconductor device, a freely bendable thin film-shaped insulating tape 4 is used as the base material of the flexible wiring board. The connecting portion 8a of each of the inner leads 8 of the wiring pattern arranged on the surface of this insulating tape 4 is electrically connected to a corresponding protrusion electrode 2 of the semiconductor chip 1. This semiconductor device is to be connected to a liquid crystal panel or a printed wiring board through the outer leads.

At present, one of the recent demands on the COF semiconductor device is to increase the number of pins. In order to satisfy this demand together with other demands for further miniaturization and thinning of the device, it is required to make finer the pitch of the connecting portions 8a of the inner leads 8 to be connected to the semiconductor chip, and the pitch of the outer leads for external connection in the wiring pattern 5, as well as to reduce the thickness of the insulating tape 4 and the wiring pattern 5.

However, in order to decrease the pitch of the inner leads 8, it is required to reduce the width of the inner leads. Further, for that purpose, it is also required to reduce the thickness of the inner leads. Accordingly, if the pitch of the inner leads is decreased, mechanical strength of the inner leads deteriorates. As a result, when the semiconductor device is used under the environment of alternately repeated low temperatures and high temperatures, namely repeated thermal expansion and thermal contraction due to temperature cycles, stress is generated in the vicinity of the edge 6b of the opening 6a of the solder resist 6 because of a difference in coefficient of thermal expansion of materials used, which leads to a problem of breaking of the inner leads 8 in that portion. For this reason, in the conventional COF structure, it is difficult to achieve fine pitches.

SUMMARY OF THE INVENTION

An object of the present invention is to provide a COF-use tape carrier that can prevent the breaking of inner leads in the vicinity of an opening of the solder resist, which tends to occur during temperature cycles, and also provide a semiconductor device produced using the tape carrier, and a method of producing the semiconductor device.

In order to accomplish the above object, a COF-use tape carrier according to an aspect of the present invention includes:

a flexible insulating tape;

a wiring pattern formed on the insulating tape, the wiring pattern including inner leads and outer leads;

a solder resist covering the inner leads, the solder resist having an opening in a portion corresponding to a semiconductor chip-mounting region of the insulating tape, with portions of the inner leads to be electrically connected to a semiconductor chip being exposed from the opening of the solder resist; and one or more dummy leads formed in the proximity of an edge of the opening of the solder resist, the dummy leads being not to be electrically connected to the semiconductor chip, wherein some spaces between adjacent two inner leads are wide and others are narrow, and the dummy lead is formed between adjacent two inner leads that are widely spaced from each other.

Due to the presence of at least one dummy lead, which are not intended to be connected to the semiconductor chip, in the proximity of the edge of the opening of the solder resist, stress applied to that portion will be shared among the inner leads and the dummy leads. Therefore, compared with a case where there is no dummy lead, stress applied to one inner lead is reduced. That is, according to the present invention, provided that the width and thickness of the inner leads in the tape carrier with the dummy leads are the same as those in the tape carrier without any dummy leads, the mechanical strength of the inner leads themselves is practically improved. Accordingly, even if the width of the inner leads is reduced, deterioration in strength can substantially be prevented, which makes it possible to cope with an increase in the number of pins.

In one embodiment, the dummy leads extend across the edge of the opening of the solder resist such that one end of each dummy lead is located within the opening of the solder resist, while the other end thereof is located under the solder resist.

Although the material and thickness of the dummy leads may be different from those of the wiring pattern, they may be preferably the same. If the dummy leads and the wiring pattern are made of different materials, those materials should have an equal expansion coefficient. If the material and thickness of the dummy leads are the same as those of the inner leads, it is possible to form the wiring pattern including the inner leads, and the dummy leads simultaneously by patterning the same wiring material, for example a copper foil. That is, they can be fabricated using the same process steps by merely adding the portions corresponding to the dummy leads to a pattern mask to be used at the time of patterning the wiring material (etching step).

The widths of the dummy leads may be equal to or narrower than a width of inner lead portions at the edge of the opening of the solder resist.

At least one of the dummy leads may be combined, or united, with an adjacent inner lead. By combining these leads, an amount of the wiring pattern on the edge of the opening of the solder resist can be increased, as compared with a case where they are not combined. This will result in further improvement of the effect of preventing the breaking of the inner leads.

The wiring pattern and the dummy leads may directly be fixed onto the insulating tape without interposition of an adhesive, or they may be fixed onto the insulating tape through the adhesive.

A COF-use tape carrier according to another aspect of the present invention includes:

a flexible insulating tape;

a wiring pattern formed on the insulating tape, the wiring pattern including inner leads and outer leads; and a solder resist covering the inner leads, the solder resist having an opening in a portion corresponding to a semiconductor chip-mounting region of the insulating tape, with portions of the inner leads to be electrically connected to a semiconductor chip being exposed from the opening of the solder resist;

wherein widths of the inner leads are broader in the proximity of the edge of the opening of the solder resist than in the portions to be electrically connected to the semiconductor chip.

In this tape carrier, the width of the inner leads is made broader in its portions in the proximity of the edge of the opening of the solder resist than in its connecting portions to be connected to a semiconductor chip. By so doing, mechanical strength of the inner leads themselves is increased without increasing the inner pitch, namely, the pitch of the inner leads. Conversely speaking, even if the pitch of the inner leads is reduced, the inner leads can retain the mechanical strength or have a mechanical strength greater than before.

The wiring pattern may directly be fixed onto the insulating tape without interposition of an adhesive. Alternatively, it may be fixed onto the insulating tape through an adhesive.

This tape carrier may further include one or more dummy leads that are not to be electrically connected to the semiconductor chip. The dummy leads are formed in the proximity of the edge of the opening of the solder resist and between adjacent two inner leads that are widely spaced from each other.

With this constitution, in addition to an increase in the mechanical strength of the inner leads due to their increased widths at the edge of the opening of the solder resist, dispersion of stress is also achieved by providing the dummy leads. This makes it possible to further enhance the effect of preventing the breaking of the inner leads. Note that when the tape carrier has additionally the dummy leads, all of the description made on the dummy leads before also applies to this tape carrier.

All of the various tape carriers mentioned above can be realized only by changing pattern masks for wiring patterns.

Thus, it is possible to produce the tape carriers using conventional facilities and techniques as they are. Therefore, the present invention is easily implemented.

Using a tape carrier having any of the above constitutions realizes a COF-structured semiconductor device that hardly suffers from breaking of the inner leads during repeated temperature cycles and therefore that can cope with an increase in the number of pins.

More specifically, a method of producing a semiconductor device using any one of the COF-use tape carriers constructed as described above includes the steps of:

joining electrodes of the semiconductor chip to the corresponding electrically connecting portions of the inner leads that are exposed from the opening of the solder resist on the insulating tape, to thereby mount the semiconductor chip on the tape carrier; and cutting out a predetermined portion including the semiconductor chip and the wiring pattern around the semiconductor chip from the tape carrier to thereby form the semiconductor device.

Typically, after mounting the semiconductor chip on the tape carrier, a gap between the semiconductor chip and the tape carrier is sealed with a resin.

In the thus formed COF-structured semiconductor device, the tape carrier portion that has been cut out serves as a flexible wiring board. And, the semiconductor chip is mounted on the insulating base material with the electrodes of the semiconductor chip being electrically connected to the tip portions, namely the connecting portions, of the inner leads within the opening of the solder resist.

Comparing the COF-structured semiconductor device of the present invention with a semiconductor device produced using the conventional tape carrier, if the pitch of inner leads in the semiconductor device of the present invention is the same as that in the conventional device, the semiconductor device of the present invention can increase the number of temperature cycles until the occurrence of failure due to the breaking of the inner leads by about 1.5 to 2 times or more.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS (First Embodiment)

Figure 1:
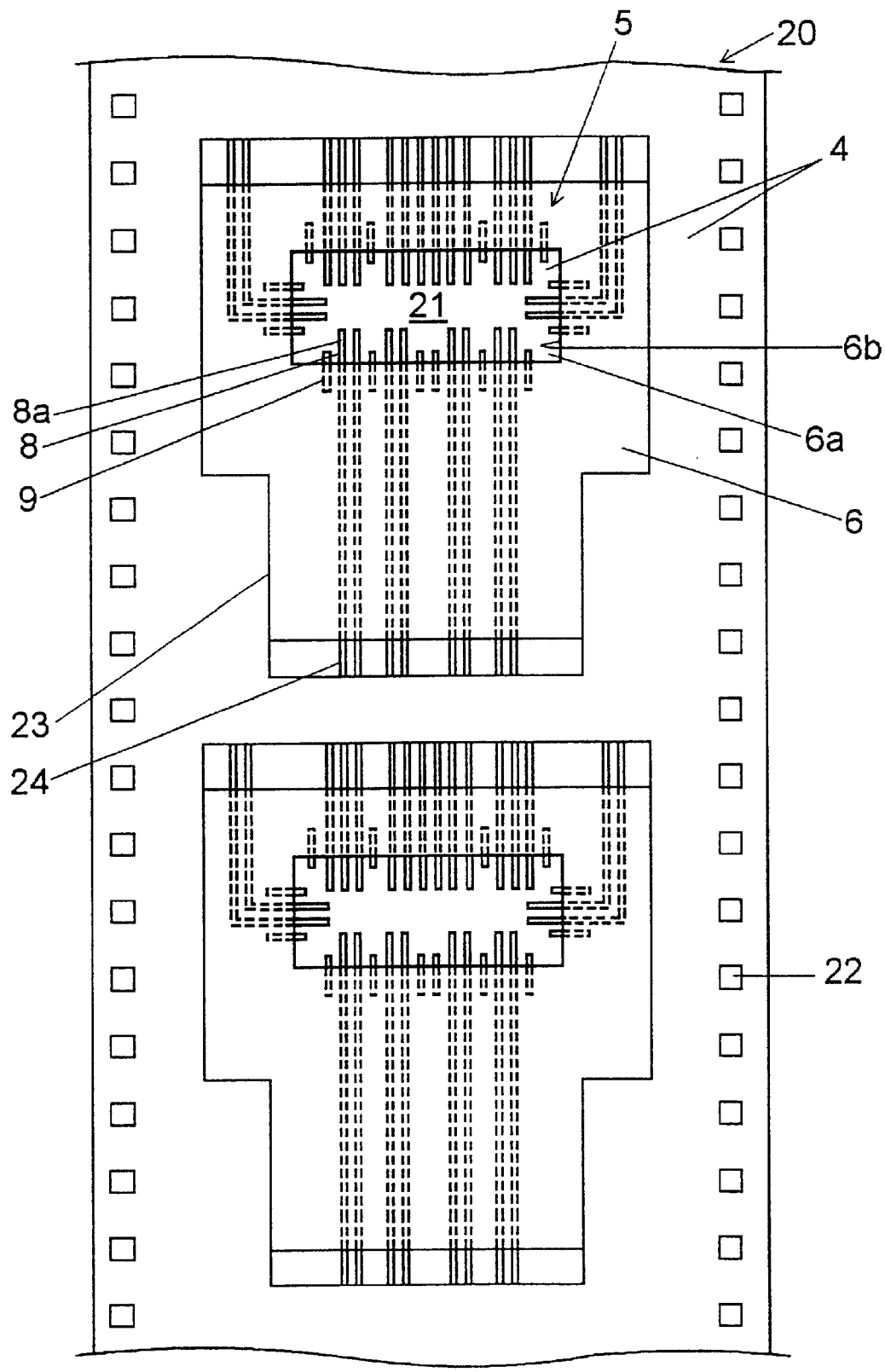
FIG. 1 is a plan view of a tape carrier according to a first embodiment of the present invention.
Figure 8:
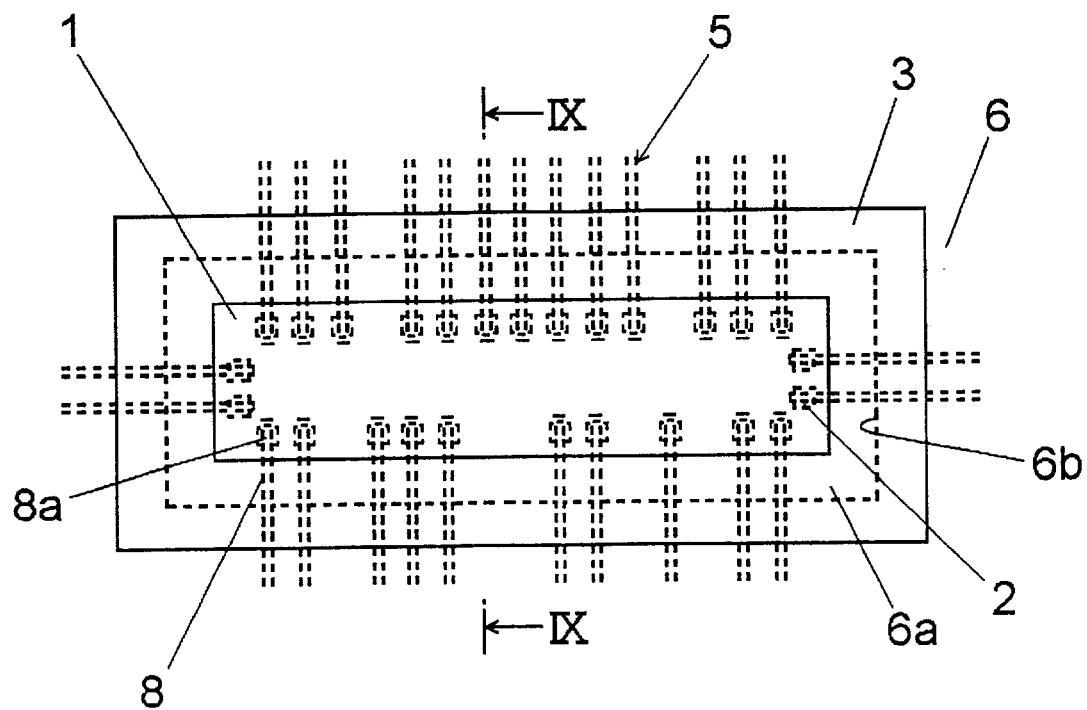
FIG. 8 is a plan view showing essential parts of a conventional COF-structured semiconductor device.
Figure 9:
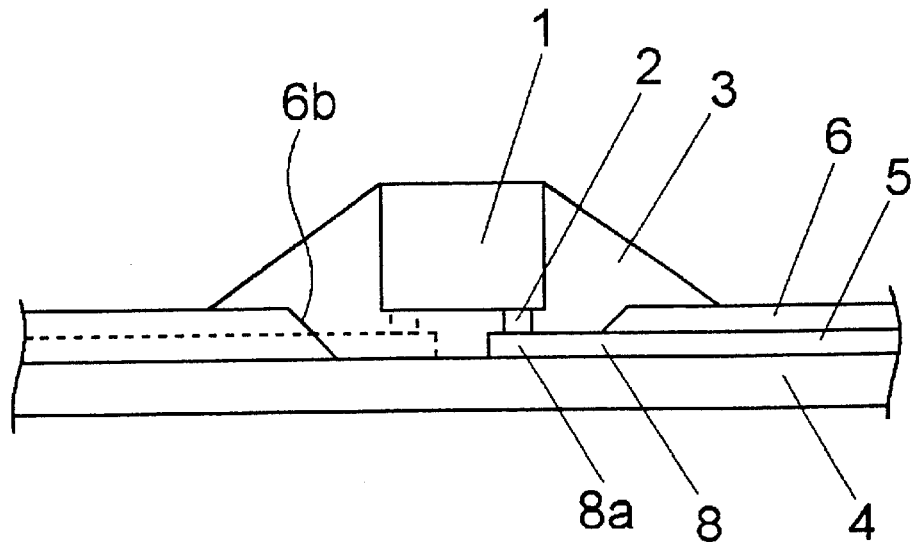
FIG. 9 is a sectional view taken along line IX—IX of FIG. 8.

FIG. 1 is a plan view showing a part of a COF-use tape carrier 20 that is one embodiment of the present invention. In FIG. 1, parts that are the same as or similar to those shown in FIGS. 8 and 9 are designated by the same reference numerals. Although the tape carrier 20 actually has a multiplicity of semiconductor chip-mounting regions 21 and wiring patters 5 corresponding to these regions, FIG. 1 shows only two sets of semiconductor chip-mounting regions 21 and wiring patterns 5.

As shown in FIG. 1, the tape carrier 20 uses a freely bendable, highly flexible, thin-film polyimide insulating tape 4 of a thickness of 15 μm (alternatively 20, 25, 38, or 40 μm) as a base material, and an 8 μm-thick (alternatively 9, 12, 15 or 18 μm-thick) copper foil pattern is formed on a top surface of the insulating tape 4 without interposition of an adhesive therebetween. A surface of the copper foil pattern is plated with tin or gold (not shown). The copper foil pattern includes a wiring pattern 5 including inner leads 8 and outer leads 24, and dummy leads 9 described below. As is apparent from the figure, some spaces are wide and others are narrow between adjacent two inner leads 8. Namely, some adjacent inner leads are widely spaced from each other, and others are narrowly spaced from each other.

The wiring pattern 5 is coated with a solder resist 6 except connecting portions to be electrically connected to corresponding electrodes of a semiconductor chip to be mounted, namely tip portions 8a of the inner leads 8, and the outer leads 24 to be connected to external terminals (e.g., terminals formed on a liquid crystal panel or a printed board). Due to the solder resist 6, the insulated state of the wiring pattern 5 is secured. This solder resist 6 has an opening 6a in a location corresponding to a semiconductor chip-mounting region 21 of the insulating tape 4. From this opening 6a, a insulating tape 4 portion including the tip portions, i.e. the connecting portions 8a, of the inner leads 8 is exposed.

In the vicinity of an edge 6b of the opening 6a of the solder resist 6, namely, an edge of the solder resist that defines the opening 6a, one or two dummy leads 9 are provided between adjacent two inner leads that are relatively widely spaced from each other, in order to indirectly reinforce the inner leads in that portion. More dummy leads may be provided if the space permits. The dummy leads 9 extend across the edge 6b of the opening 6a such that one end of each dummy lead 9 is located within the opening 6a of the solder resist 6, while the other end thereof is located under the solder resist 6. The dummy leads 9 do not need to extend far from the edge 6b of the opening of the solder resist 6 in view of their purposes.

In the present embodiment, the dummy leads 9 and the wiring pattern 5 are simultaneously formed by forming common copper foil into a linear-shaped pattern shown in FIG. 1. Thus, both of the dummy leads 9 and the wiring pattern 5 are of the same material and thickness. Further, the widths of the inner leads 8 and the dummy leads 9 are individually constant along their lengths. Further, the inner leads 8 and the dummy leads 9 are equal in width. However, the width of the dummy leads 9 may be narrower than that of the leads, more specifically, of the inner leads 8 located on the edge 6b of the opening of the solder resist.

In FIG. 1, reference numeral 22 indicates feed holes for conveying the tape carrier, which are provided on opposite sides of the insulating tape 4. Also, reference numeral 23 indicates portions to be cut out after completion of production process steps, such as mounting of semiconductor chips on the tape carrier 20. After cut out from the tape carrier, the portions 23 function as flexible wiring boards in semiconductor devices.

Figure 2:
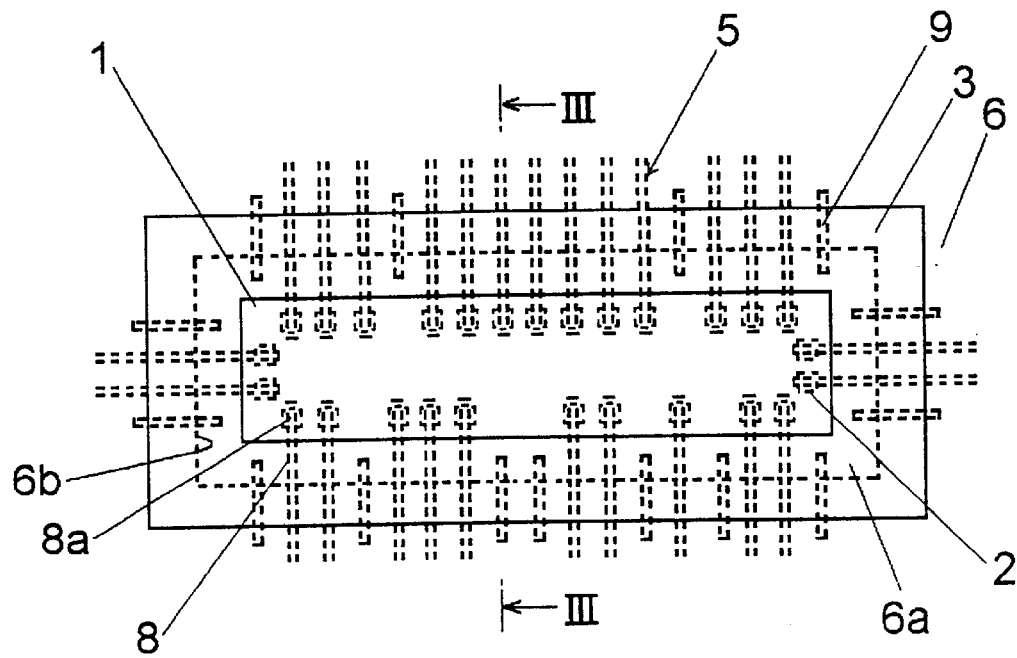
FIG. 2 is a plan view of a COF-structured semiconductor device produced using the tape carrier shown in FIG. 1.
Figure 3:
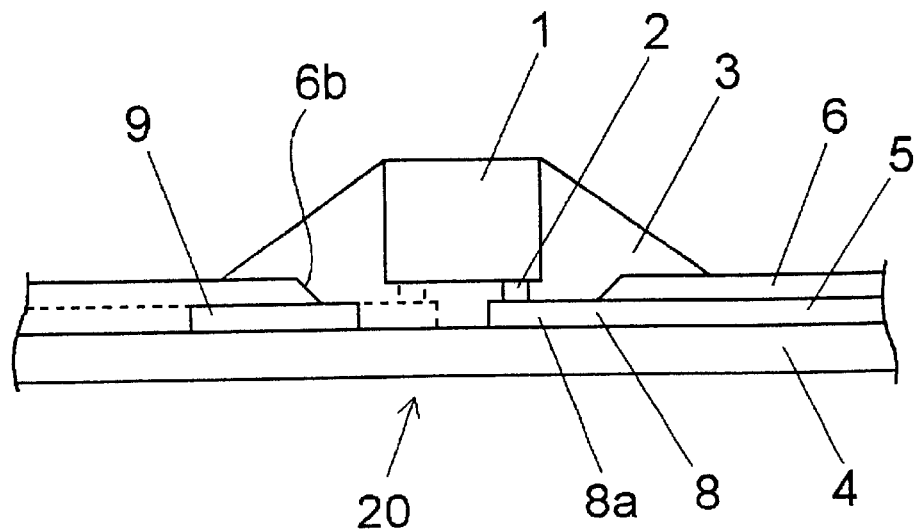
FIG. 3 is a sectional view taken along line III—III of FIG. 2.

While conveying the carrier tape having the above constitution by means of the feed holes 22, semiconductor chips are mounted on the semiconductor-mounting regions. After that, resin is injected into gaps between the semiconductor chips and the carrier tape 20 for sealing. Conditions in the vicinity of one semiconductor chip after injecting the sealing resin are shown in FIGS. 2 and 3. FIG. 2 is a plan view, and FIG. 3 is a sectional view taken along line III—III of FIG. 2. In these figures, parts that are same as or similar to those shown in FIGS. 8 and 9 are designated by the same reference numerals.

As is apparent from the figures, the connecting portions 8a of the inner leads 8 on the insulating tape 4 are joined and thus electrically connected to the protrusion electrodes 2 called bumps of the semiconductor chip. On the other hand, end portions of the dummy leads 9 on the side of the semiconductor chip are located between an outer edge of the semiconductor chip 1 and the edge 6b of the opening 6a of the solder resist and thus are not electrically connected to the semiconductor chip 1. A gap between the semiconductor chip 1 and the carrier tape 20 is sealed by the resin 3 that has been injected. As is apparent from FIG. 1, the sealing resin 3 is formed overlapping the solder resist 6. In the example shown in FIGS. 2 and 3, the other end portions of the dummy leads 9 opposite from the semiconductor chip extend so as to be located outside the region sealed by the sealing resin 3. Alternatively, these end portions may be located inside the sealed region.

After injection of the sealing resin 3, the portion 23 to be cut out shown in FIG. 1 is cut out from the carrier tape 20 to form a COF-structured semiconductor device.

In the COF-structured semiconductor device thus formed, stress developed in the proximity of the edge 6b of the opening of the solder resist is shared among the inner leads 8 and the dummy leads 9. Therefore, compared with the conventional semiconductor device shown in FIGS. 8 and 9 that uses no dummy lead, breaking of inner leads in the proximity of the edge of the opening of the solder resist hardly occurs. Thus, if the semiconductor device of the present embodiment has the same constitution as the conventional one except the dummy leads, the number of temperature cycles until the occurrence of failure due to the breaking of the inner leads can be increased to be twice or more, though it depends on the number of dummy leads.

Figure 4:
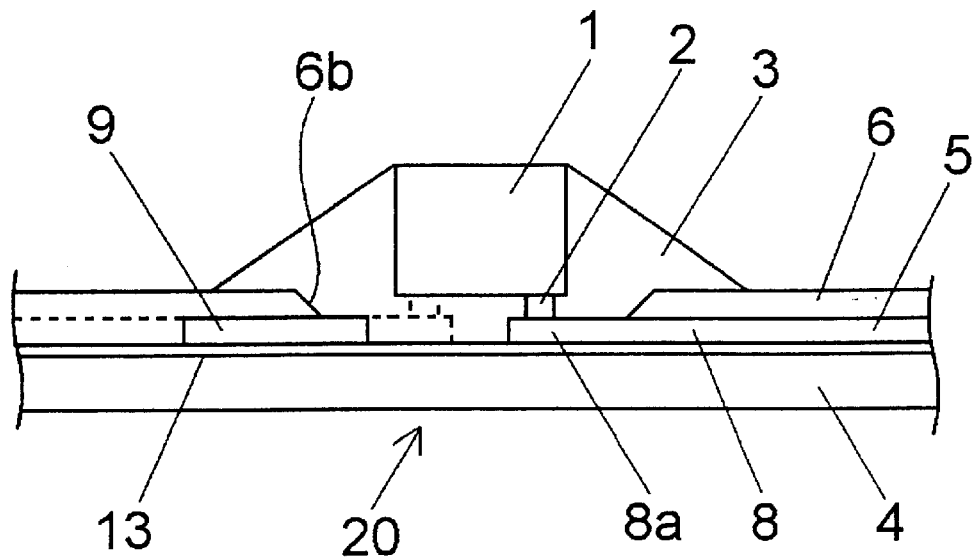
FIG. 4 is a sectional view similar to FIG. 3, showing a modification.

In the tape carrier 20 described above, the copper foil pattern (the wiring pattern 5 and the dummy leads 9) is directly formed on the insulating tape 4. The copper foil pattern may also be formed through an adhesive 13, as shown in FIG. 4.

(Second Embodiment)

Figure 5:
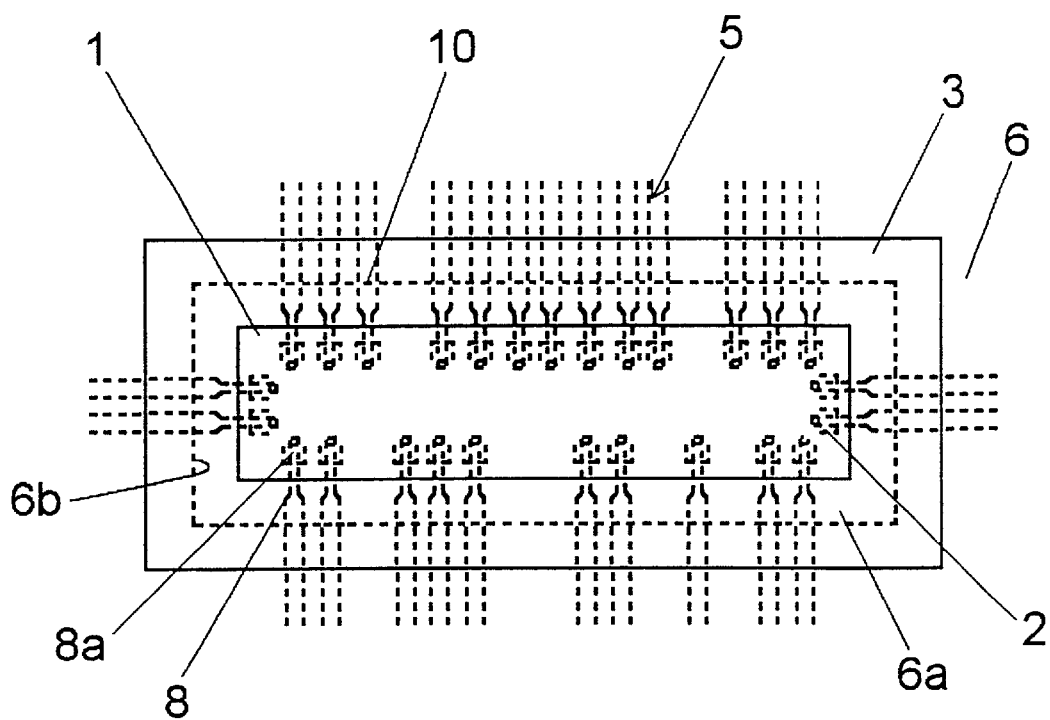
FIG. 5 is a plan view similar to FIG. 2, which shows a semiconductor device according to a second embodiment of the present invention.

FIG. 5 is a view similar to FIG. 2, which shows a second embodiment. Only features different from the first embodiment will be described.

In the first embodiment, the dummy leads 9 are made to bear a share of the stress to reduce a stress applied to the narrow inner leads 8 themselves, thereby preventing the breaking of the leads. On the other hand, in this second embodiment, the width of inner lead portions in the proximity of the edge 6b of the opening of the solder resist is larger than the width of the connecting portions 8a to be connected to the semiconductor chip. This structure improves the mechanical strength of the inner leads themselves in that area to thereby prevent the breaking of the leads in the proximity of the edge of the opening of the solder resist. The width of the wide inner lead portions 10 is preferably at least half of the pitch of the inner leads (although it should be smaller than the pitch).

Compared with the semiconductor device shown in FIGS. 8 and 9, the semiconductor device having the construction shown in FIG. 5 hardly undergoes the breaking of the inner leads in the proximity of the opening of the solder resist. This makes it possible to attain a 1.5 to 2-fold increase in the number of temperature cycles until the occurrence of failure due to the breaking of the inner leads.

Figure 6:
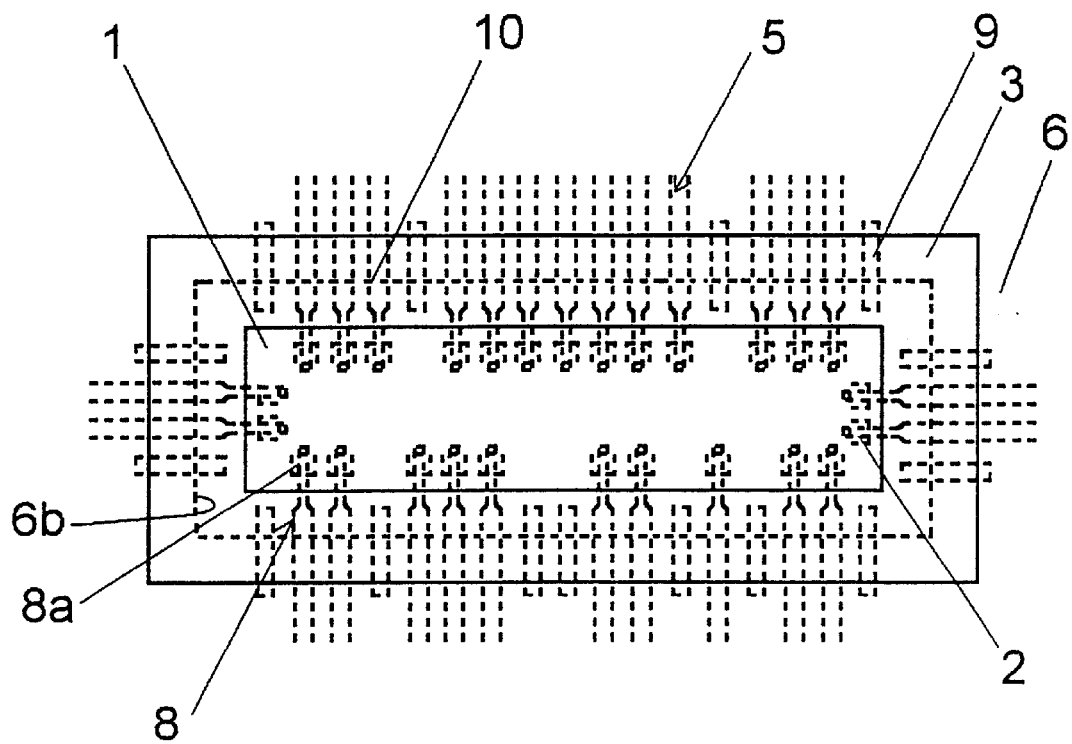
FIG. 6 is a plan view similar to FIG. 2, which shows a modification.

Although no dummy lead is used in the example shown in FIG. 5, dummy leads 9 may be used in combination with the inner leads, as shown in FIG. 6. In the latter case, the occurrence of the breaking of the inner leads can be moreover suppressed. The width of the dummy leads may be equal to the width of the inner lead portions 10, as shown in FIG. 6, or may be narrower.

(Third Embodiment)

Figure 7:
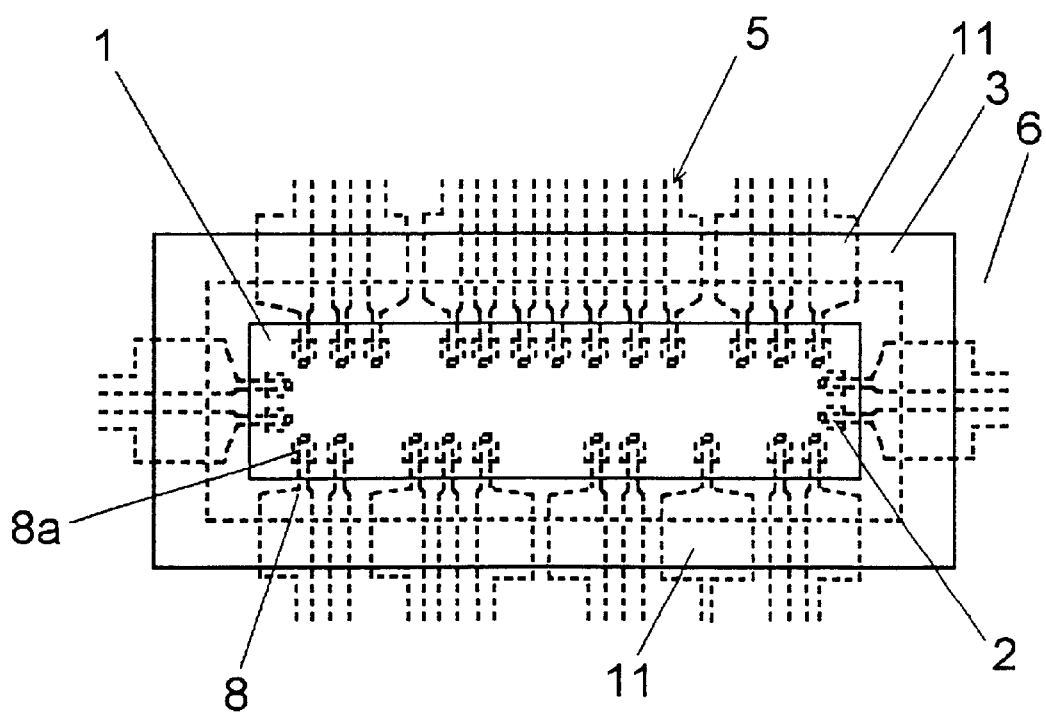
FIG. 7 is a plan view similar to FIG. 2, which shows a semiconductor device according to a third embodiment of the present invention.

Another embodiment is shown in FIG. 7. In the examples shown in FIGS. 1, 2 and 6, the dummy leads 9 are provided separately from the inner leads 8. However, in the example shown in FIG. 7, one inner lead portion 10 shown in FIG. 6 is combined with a dummy lead 9 on one side or dummy leads 9 on both sides of the inner lead portion to thereby realize a substantially widened inner lead portion 11. This embodiment provides a structure that is far less susceptible of the breaking of the inner leads compared with a case where the dummy leads are formed independently of the inner leads, because the amount of the copper foil present on the edge of the opening of the solder resist can be increased.

The inner leads 8 shown in FIGS. 1 and 2 (those that do not have a portion corresponding to the widened inner lead portion 10) and the dummy leads 9 may be combined, or united.

Furthermore, it is not required that all the dummy leads 9 be combined as in the case illustrated, but only any one of these leads may be combined.

The constitutions of the dummy leads and the inner leads in the embodiments and their modifications described above may be appropriately combined. Further, the sizes and materials used, the shape of leads, the number of leads, the shape of portions to be cut out and the like may be variously changed.

As is apparent from the above description, according to the present invention, in the flexible wiring board of the COF-structured semiconductor device, namely in the tape carrier that provides the flexible wiring board, the inner leads in the proximity of the opening of the solder resist are directly or indirectly reinforced by providing the dummy leads in the proximity thereof or by broadening the width of the inner leads in those portions. Therefore, the semiconductor device of the present invention makes it possible to improve its life in terms of the number of temperature cycles until the occurrence of failure due to the breaking of the inner leads by twice or more.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A COF-use tape carrier, which is a tape carrier for mounting a semiconductor chip thereon by a chip-on-film method, comprising:
    a flexible insulating tape;
    a wiring pattern formed on the insulating tape, the wiring pattern including inner leads and outer leads;
    a solder resist covering the inner leads, the solder resist having an opening in a portion corresponding to a semiconductor chip-mounting region of the insulating tape, with portions of the inner leads to be electrically connected to a semiconductor chip being exposed from the opening of the solder resist; and
    one or more dummy leads formed in the proximity of an edge of the opening of the solder resist, the dummy leads being not to be electrically connected to the semiconductor chip,
    wherein some spaces between adjacent two inner leads are wide and others are narrow, and the dummy lead is formed between adjacent two inner leads that are widely spaced from each other.

2. The COF-use tape carrier according to claim 1, wherein the dummy leads extend across the edge of the opening of the solder resist such that one end of each dummy lead is located within the opening of the solder resist, while the other end thereof is located under the solder resist.

3. The COF-use tape carrier according to claim 1, wherein material and thickness of the dummy leads are same as material and thickness of the wiring pattern.

4. The COF-use tape carrier according to claim 1, wherein widths of the dummy leads are equal to or narrower than a width of inner lead portions at the edge of the opening of the solder resist.

5. The COF-use tape carrier according to claim 1, wherein at least one of the dummy leads is combined with an adjacent inner lead.

6. The COF-use tape carrier according to claim 1, wherein both the wiring pattern and the dummy leads are fixed onto the insulating tape through an adhesive.

7. A method of producing a semiconductor device using the COF-use tape carrier of claim 1, the method comprising the steps of:
    joining electrodes of the semiconductor chip to the corresponding electrically connecting portions of the inner leads that are exposed from the opening of the solder resist on the insulating tape, to thereby mount the semiconductor chip on the tape carrier; and
    cutting out a predetermined portion including the semiconductor chip and the wiring pattern around the semiconductor chip from the tape carrier to thereby form the semiconductor device.

8. The method according to claim 7, wherein, after mounting the semiconductor chip on the tape carrier, a gap between the semiconductor chip and the tape carrier is sealed with resin.

9. A COF-use tape carrier, which is a tape carrier for mounting a semiconductor chip thereon by a chip-on-film method, comprising:
    a flexible insulating tape;
    a wiring pattern formed on the insulating tape, the wiring pattern including inner leads and outer leads; and
    a solder resist covering the inner leads, the solder resist having an opening in a portion corresponding to a semiconductor chip-mounting region of the insulating tape, with portions of the inner leads to be electrically connected to a semiconductor chip being exposed from the opening of the solder resist;
    wherein widths of the inner leads are broader in the proximity of the edge of the opening of the solder resist than in the portions to be electrically connected to the semiconductor chip.

10. The COF-use tape carrier according to claim 9, wherein some spaces between adjacent two inner leads are wide and others are narrow, and the tape carrier further comprises one or more dummy leads not to be electrically connected to the semiconductor chip, the dummy leads being formed in the proximity of the edge of the opening of the solder resist and between adjacent two inner leads that are widely spaced from each other.

11. The COF-use tape carrier according to claim 10, wherein the dummy leads extend across the edge of the opening of the solder resist such that one end of each dummy lead is located within the opening of the solder resist, while the other end thereof is located under the solder resist.

12. The COF-use tape carrier according to claim 10, wherein material and thickness of the dummy leads are same as material and thickness of the wiring pattern.

13. The COF-use tape carrier according to claim 10, wherein widths of the dummy leads are equal to or narrower than a width of inner lead portions at the edge of the opening of the solder resist.

14. The COF-use tape carrier according to claim 10, wherein at least one of the dummy leads is combined with an adjacent inner lead.

15. The COF-use tape carrier according to claim 10, wherein both the wiring pattern and the dummy leads are fixed onto the insulating tape through an adhesive.

16. A method of producing a semiconductor device using the COF-use tape carrier of claim 10, the method comprising the steps of:

joining electrodes of the semiconductor chip to the corresponding electrically connecting portions of the inner leads that are exposed from the opening of the solder resist on the insulating tape, to thereby mount the semiconductor chip on the tape carrier; and cutting out a predetermined portion including the semiconductor chip and the wiring pattern around the semiconductor chip from the tape carrier to thereby form the semiconductor device.

17. The method according to claim 16, wherein, after mounting the semiconductor chip on the tape carrier, a gap between the semiconductor chip and the tape carrier is sealed with resin.

18. A chip-on-film-structured semiconductor device having a flexible wiring board and a semiconductor chip, wherein the flexible wiring board comprises:

a flexible insulating base material;

a wiring pattern formed on the insulating base material, the wiring pattern including inner leads and outer leads;

a solder resist having an opening in a portion corresponding to a chip-mounting region of the insulating base material and covering the inner leads except tip portions thereof; and one or more dummy leads formed in proximity of an edge of the opening of the solder resist, the dummy leads being not electrically connected to the semiconductor chip, wherein some spaces between adjacent two inner leads are wide and others are narrow, the dummy lead being formed between adjacent two inner leads that are widely spaced, and wherein the semiconductor chip is mounted on the insulating base material with the electrodes of the semiconductor chip being electrically connected to the tip portions of the inner leads within the opening of the solder resist.

19. The semiconductor device according to claim 18, further comprising a sealing resin to seal a gap between the semiconductor chip and the flexible wiring board.

20. A chip-on-film-structured semiconductor device having a flexible wiring board and a semiconductor chip, wherein the flexible wiring board comprises:

a flexible insulating base material;

a wiring pattern formed on the insulating base material, the wiring pattern including inner leads and outer leads; and a solder resist having an opening in a portion corresponding to a chip-mounting region of the insulating base material and covering the inner leads except tip portions thereof, wherein the semiconductor chip is mounted on the insulating base material with the electrodes of the semiconductor chip being electrically connected to the tip portions of the inner leads within the opening of the solder resist, and wherein widths of the inner leads are broader in the proximity of the edge of the opening of the solder resist than in the tip portions electrically connected to the semiconductor chip.

21. The semiconductor device according to claim 20, further comprising a sealing resin to seal a gap between the semiconductor chip and the flexible wiring board.

* * * * *